US007027009B1

(12) United States Patent
Adams et al.

(10) Patent No.: US 7,027,009 B1
(45) Date of Patent: Apr. 11, 2006

(54) METHOD AND APPARATUS FOR SIMULTANEOUS TRANSMISSION OF SAME FREQUENCIES

(75) Inventors: Richard C. Adams, San Diego, CA (US); Barry R. Hunt, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/295,958

(22) Filed: Apr. 21, 1999

(51) Int. Cl.
*G01R 21/00* (2006.01)

(52) U.S. Cl. ...................................................... 343/894

(58) Field of Classification Search ................ 343/895, 343/753, 853, 754; 455/323, 277.2, 134, 455/135, 327
See application file for complete search history.

(56) References Cited

U.S. PATENT DOCUMENTS

| | | | | |
|---|---|---|---|---|
| 2,977,594 | A | 3/1961 | Marston et al. | |
| 3,137,002 | A | 6/1964 | Kaiser, Jr. et al. | |
| 3,562,756 | A | 2/1971 | Kuo et al. | |
| 3,906,514 | A | 9/1975 | Phelan | |
| 3,956,752 | A * | 5/1976 | Phelan et al. | 343/754 |
| 4,243,993 | A | 1/1981 | Lamberty et al. | |
| 4,605,934 | A | 8/1986 | Andrews | |
| 5,164,738 | A * | 11/1992 | Walter et al. | 343/789 |
| 5,227,807 | A * | 7/1993 | Bohlman et al. | 343/895 |
| 5,451,973 | A | 9/1995 | Walter et al. | |
| 5,471,664 | A | 11/1995 | Kim | |
| 5,706,017 | A * | 1/1998 | Buttgenbach | 343/753 |
| 5,787,335 | A | 7/1998 | Novak | |
| 5,831,582 | A | 11/1998 | Muhlhauser et al. | |
| 6,166,694 | A * | 12/2000 | Ying | 343/702 |
| 6,621,463 | B1 * | 9/2003 | Lam | 343/792.5 |
| 6,864,856 | B1 * | 3/2005 | Lynch et al. | 343/895 |

* cited by examiner

*Primary Examiner*—Tuyet Vo
*Assistant Examiner*—Huedung X. Cao
(74) *Attorney, Agent, or Firm*—Peter A. Lipovsky; Michael A. Kagan; Allan Y. Lee

(57) ABSTRACT

A method and apparatus for communicating simultaneously at the same frequencies includes two or more conductor-backed, spiral antennas that have been shown to exhibit linear polarization. To permit simultaneous transmission on the same frequencies, two of the linearly polarize, conductor-backed spiral antennas can be spaced vertically and be oriented so that the feed points of one antenna are orthogonal to the feed points of the second antenna. Since the specifically designed spiral antennas will be both transmitting or both receiving at orthogonally arranged polarizations, the antennas will not interfere with each other, even though communication is upon substantially the same frequencies.

45 Claims, 5 Drawing Sheets

COORDINATE SYSTEM USED

IN THE $\phi = 0°$ PLANE $E_H = |E_\theta|$ $E_V = |E_\phi|$

METHOD AND APPARATUS FOR SIMULTANEOUS TRANSMISSION OF SAME FREQUENCIES

BACKGROUND OF THE INVENTION

This invention relates generally to communications and more specifically to communications accomplished via spiral antennas. More specifically, the invention relates to utilizing a spiral antenna design that provides linear polarization. With greater specificity, but without limitation thereto, the invention relates to using two or more linearly polarized, conductor-backed, spiral antennas to simultaneously transmit upon the same frequencies without interfering with each other.

Typically, antennas transmitting simultaneously on the same frequency will interfere with one another. Depending on the relative intensities of the transmissions, one transmission can overwhelm or "drown out" the other transmission.

Certain prior art methods designed to use the frequency spectrum efficiently rely upon complex methods of interlacing messages by time (TDMA) or by coding (CDMA). Another method uses crossed-log periodic antennas. The crossed-log antennas have broad bands and are linearly polarized but are not physically compact. Typically, these antennas extend in the direction perpendicular to propagation on the order of 0.5 wavelength and are often several times the wavelength in size in the direction along the line of propagation. Crossed dipoles and patches are yet a further application. These are relatively compact and are linearly polarized, but are not broad band. Yet another scheme of enhancing communications can be found in the satellite communication field. Antennas used to communicate with satellites often use helices. The uplink signal is typically orthogonal to the downlink signal (e.g. right circularly polarization versus left circular polarization). Helical antennas are rarely compact. The cavity-backed spiral is another design that has been used in many antenna systems. The polarization of a cavity-backed spiral is typically circular and could be used in a dual transmitting mode by transmitting a right-circular polarized signal and receiving a left-circular polarized signal. In the cavity-backed spiral design, half the power utilized is absorbed in the cavity behind the spiral.

There is therefore a need within the art to provide an enhanced method of communicating that permits simultaneous transmission at the same frequencies from a relatively simple antenna system of efficient, compact and broad-band design.

SUMMARY OF THE INVENTION

The invention provides a method and apparatus in which two or more conductor-backed, spiral antennas are used to simultaneously transmit or receive upon the same frequencies without interference. The conductor-backed spirals are broad-band in operation, typically exhibiting a 9:1 ratio of maximum to minimum frequency. These spirals are also efficient, experiencing approximately a 6 dB advantage in gain on transmit and receive compared to a cavity-backed spiral.

The invention utilizes specifically designed conductor-backed spiral antennas shown to exhibit linear polarization. For these conductor-backed spiral antennas, a change in frequency is synchronized to a change in the polarization vector of the communication signal. The amplitude (change in dB) of the polarity change is related in general to the thickness of the dielectric layer between the radiating elements of the antenna and its conductor backing.

To permit simultaneous transmission on the same frequencies, two, for example, of the linearly polarized, conductor-backed spiral antennas can be spaced vertically, for example, and are oriented so that the feed points of one antenna are orthogonal to the feed points of the second antenna. Since the specifically designed spiral antennas will be both transmitting or both receiving at orthogonally arranged polarizations, the antennas will not interfere with each other, even though communication is upon substantially the same frequency.

Accordingly, it is an object of this invention to provide a communication method and apparatus that enhances the efficiency of communication.

A further object of this invention is to provide a communication method and apparatus that enhances the efficiency of communication by using an antenna of simple design.

Yet another object of this invention is to provide a communication method and apparatus that enhances the efficiency of communication by using an antenna of relatively compact design.

Still a further object of this invention is to provide a communication method and apparatus that enhances the efficiency of communication by using an antenna of broad-band design.

Still a further object of this invention is to provide a communication method and apparatus that enhances the efficiency of communication by using an efficient antenna of simple, compact and broad-band design incorporating spiral antenna elements.

Other objects, advantages and new features of the invention will become apparent from the following detailed description of the invention when considered in conjunction with the accompanying drawings.

DESCRIPTION OF THE PREFERRED EMBODIMENT

Research conducted by the U.S. Navy on antennas has indicated that specific spiral antennas of conductor-backed design are linearly polarized over a broad frequency band. This polarization has been found to depend upon frequency, the number of turns of the spiral antenna elements and the thickness of a dielectric disposed between the spiral antenna elements and their corresponding conductor backing.

The Navy study found that increasing the number of turns of the spiral increases the occurrence of polarization changes (from horizontal to vertical and vice-versa) for a given frequency range. It was also learned that in general the thickness of the dielectric layer between the spiral radiating elements and the conductor backing determines the magnitude (change in dB) of the polarization effect. For a conductor-backed spiral antenna with a relatively thin dielectric layer (one that is small compared to the utilized wavelength), a small change in frequency can cause a relatively large change in polarization. The studies were conducted on two-arm spirals, however it is envisioned that similar effects may also be attributable to conductor-backed spiral antennas having more than two spiral arms.

Figure 1:
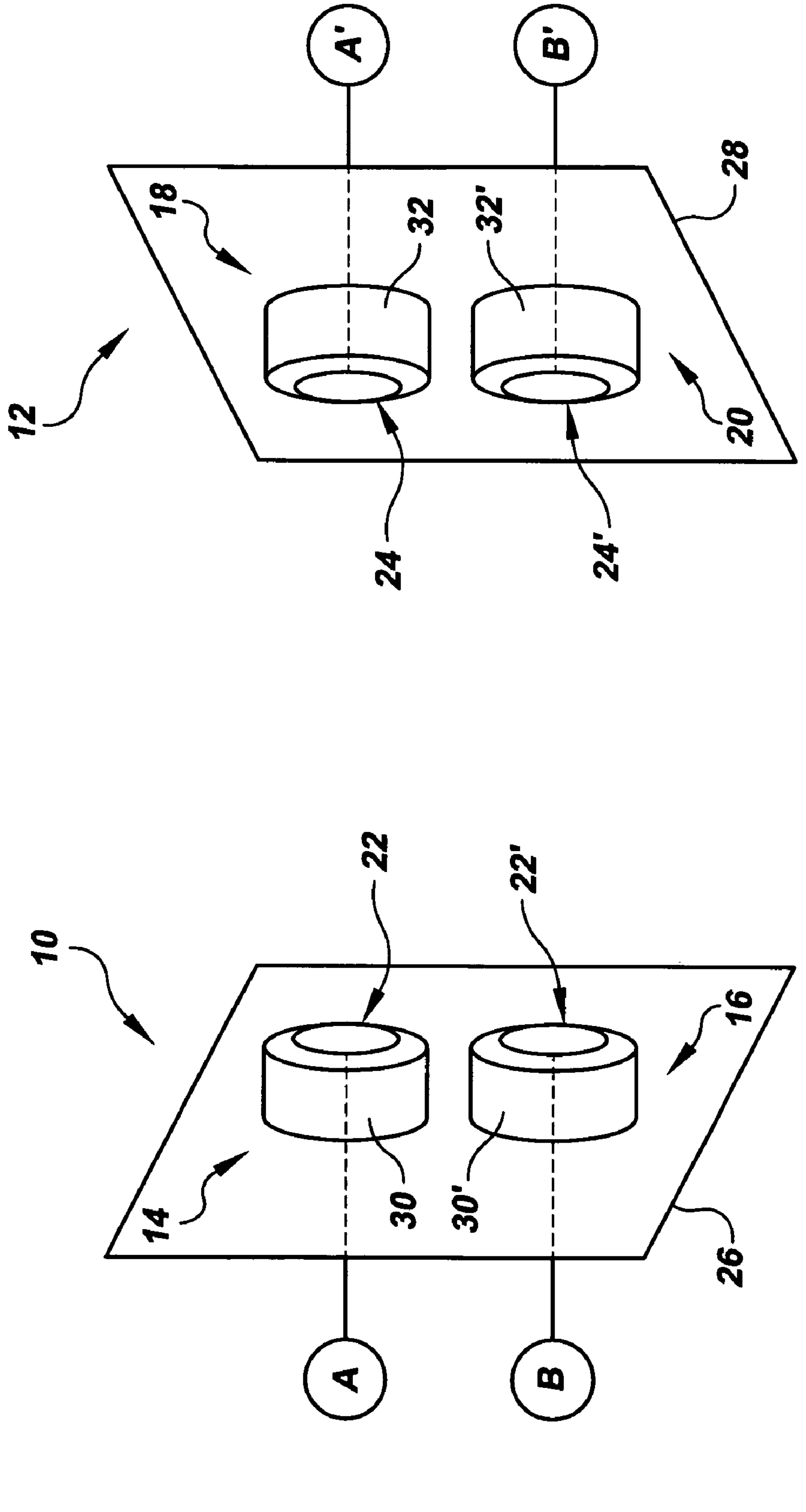
FIG. 1 illustrates an exemplary schematic of the invention.

Referring now to FIG. 1, a schematic of the invention is shown. Transmitting array 10 and receiving array 12 are substantially identical in physical as well as performance characteristics. Transmitting array 10 comprises two linearly polarized, broad band, conductor-backed spiral antennas 14 and 16 that are displaced vertically with respect to each other. Similarly, receiving array 12 comprises two linearly polarized, broad band, conductor-backed spiral antennas 18 and 20 that are also displaced vertically with respect to each other. The antennas should be designed and fabricated to be substantially identical in physical features, resulting also in a duplication of performance characteristics. As well be explained, however, the feeds on the antennas of each array are oriented orthogonally with respect to each other to provide different polarizations from the array.

The spiral antennas will be described in greater detail, however, as a general description, each of the antennas include at least a pair of spiral radiating elements or arms shown generally as 22 and 22' and 24 and 24'.

Although antennas having two-armed spirals have been successfully employed to achieve desired polarization characteristics, it is also envisioned that spiral antennas containing a greater number of arms may also exhibit similar polarization performance characteristics. In the spiral antennas researched, the spiral radiating elements followed an Archimedean path and had two foot diameters of a variety of turns. As is well understood in the art of spiral antennas, the maximum diameter of the spirals and inner gap dimensions are determined by the minimum and maximum frequencies anticipated to be used with the antennas. Further, those skilled in the art will appreciate that other spiral configurations of the antenna elements of the invention may also be possible and still fall within the metes and bounds of the invention disclosed here.

Shown are conductor backings 26 and 28 for use with arrays 10 and 12, respectively. In conjunction with the two foot outer diameter spirals described here, a suitable conductor backing can take the configuration of a three foot by six foot rectangular plate. As can be seen the spiral radiating elements are separated from the conductor backings by a dielectric substrate 30, 30' and 32, 32" having substantially flat, opposite sides. A suitable dielectric for this purpose is marketed under the trademark name of DIVINYCELL and has a dielectric constant of approximately 1. Others materials with different dielectric constants could also be used to advantage.

In research conducted and as well be further explained, this substrate was varied in thickness to ascertain its affect on polarization performance. As a result of this research, it was learned that the degree (or change in dB) to which horizontal or vertical polarization dominates depends upon the distance between the spiral radiating elements and the ground plane. To enhance a change in polarization upon a change in transmitted/or received frequency, the distance between the spiral elements and the ground plane (conductor) should be a small fraction of a wavelength of the energy radiated or received.

Referring again to FIG. 1, a transmitted signal “A” is received as signal “A'” and a transmitted signal “B” is received as signal “B'”. In this case, signals “A” and “B” have the same frequency, but are of a different polarization, as will be further explained.

Figure 2:
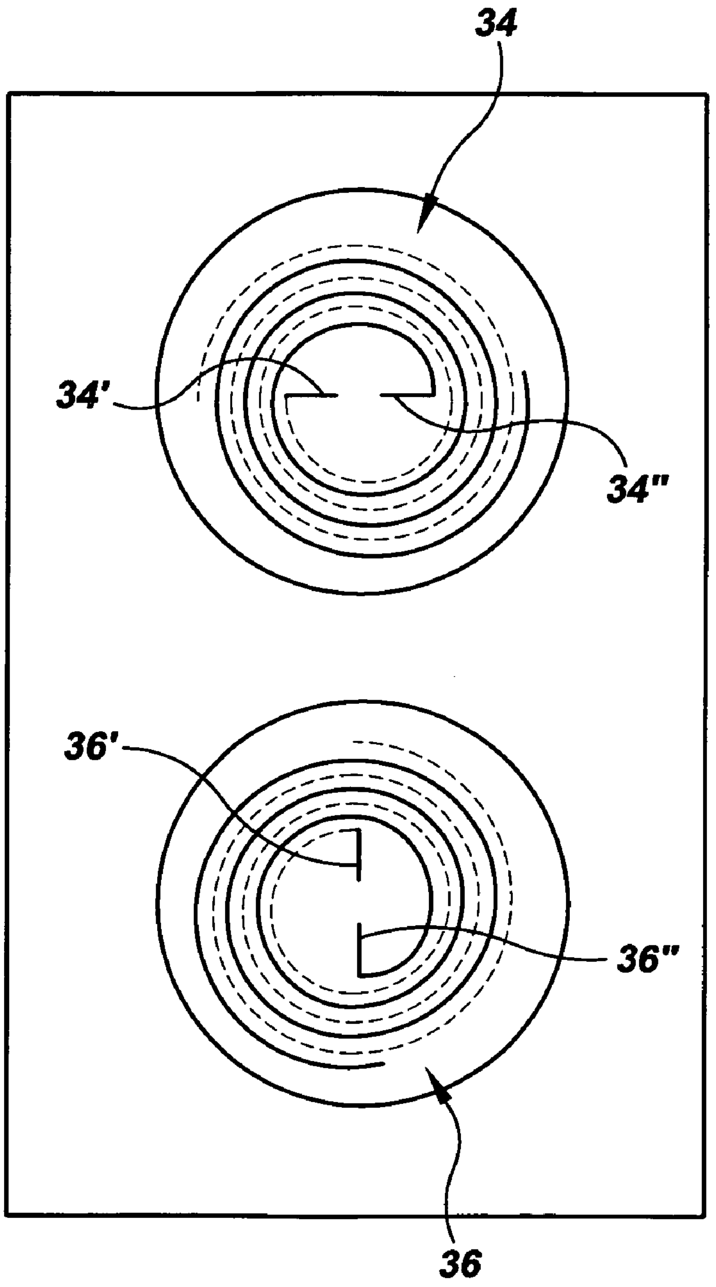
FIG. 2 illustrates a detailed view of the orientation of antennas as may be used according to the invention.

Referring now to FIG. 2, a detailed view of spiral antennas as may be used with the invention are shown. Illustrated is a single array which may be used for either transmitting or receiving. An important consideration is that the two arrays and corresponding antennas are oriented substantially the same. In the example shown, vertically displaced spiral antennas 34 and 36 have polarization vectors that are orthogonal to each other.

The orthogonality of the polarization vector permits two signals with the same frequency to be transmitted and received without interference with each other. This is accomplished by orienting an imaginary line drawn through the separate feed points of the antennas to be mutually perpendicular.

Referring again to FIG. 2, it can be seen that a line drawn through feed points 34' and 34" of antenna 34 and a line drawn through feed points 36' and 36" of antenna 36 are substantially perpendicular.

Referring now to FIGS. 3 A–C, a representative conductor-backed spiral antenna 38 according to one embodiment of the invention is shown. Of, course, this representative example is meant to be used for explaining the invention and should not be considered to be the one and only way in which the invention can be accomplished or even one a few ways in which the invention can be realized.

Figure 3A:
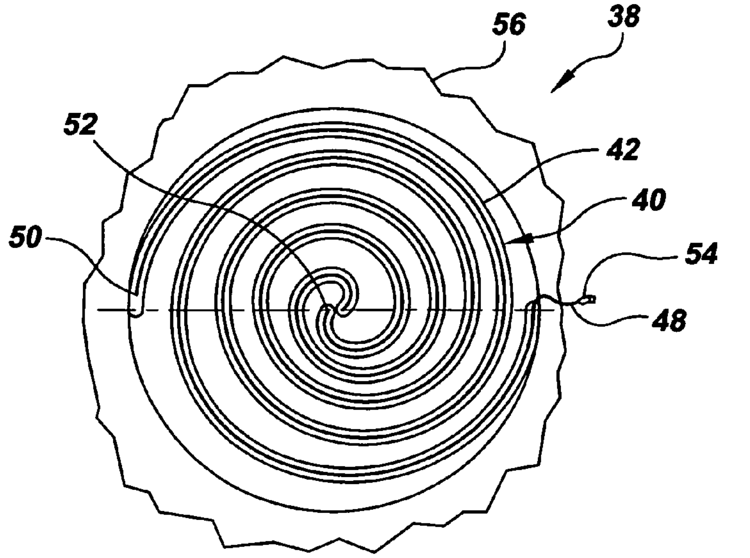
FIGS. 3 A–C illustrate an exemplary conductor-backed spiral antenna as may be used in the method of the invention.
Figure 3B:
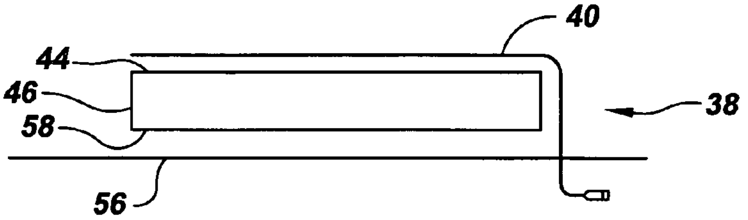

Referring to FIGS. 3A and 3B, spiral antenna 38 is shown to comprise spiral radiating elements 40, in this example shown as encompassing two arms of three turns and encompassing an actual outer diameter of two feet. Utilization of this spiral antenna has been successful with the use of two arms, however it is envisioned that a greater number of arms may also provide satisfactory results. Similarly, use of three turns has shown positive results, but an increase in the number of turns has also shown satisfactory, if not improved, performance for applications of the invention. Thus the two arm, three turn spiral elements described here is by no means intended to be a limitation of the invention.

In the specific example presented, spiral elements 40 are made up of photolithically applied conductive metal traces 42 applied to a first substantially flat side 44 of a dielectric substrate 46. Attached to metal traces 42 is a coaxial cable 48. In this implementation of the invention, the outer braided grounding shield (not shown) of coaxial cable 48 is soldered to metal traces 42 at various points along the path of the traces. At outer end 50 of spiral elements 40, the inner conductor (not shown) of coax cable 48 is shorted to the outer braid of the cable. At inner end 52 of spiral elements 40, the inner conductor of the two arms are joined and are soldered to the outer braid of the coax cable.

In this embodiment, the radiating elements are center-fed by means of an infinite balun. Alternatively, it can be envisioned that the antenna could be edge-fed by a balun. Connector 54 provides an input/output to the antenna elements and also an energization point. As is known in the art of spiral antennas, the length of the radiating elements and accordingly their largest diameter and inner gap are a function of the frequency expected to be used. As this is well understood within the art, greater details of this aspect of the antennas will not be presented here. It should also be understood that the particular feed and antenna energizations schemes discussed herein as well as the design of the spiral elements disclosed could be replaced by other configurations known in the art and still fall within the spirit of the invention disclosed here providing that an orthogonal feed arrangement as discussed above is maintained.

As can also be seen in FIGS. 3A and 3B, a conductor backing 56 is applied to a second substantially flat side 58 of dielectric substrate 46, such as by way of an adhesive. As previously described, the thickness or distance of the dielectric member between spiral radiating arms 40 and conductor backing 56 was varied to determine what affect, if any, this would have on varying the polarization of the antennas. Following is a description of the findings of this research.

Figure 3C:
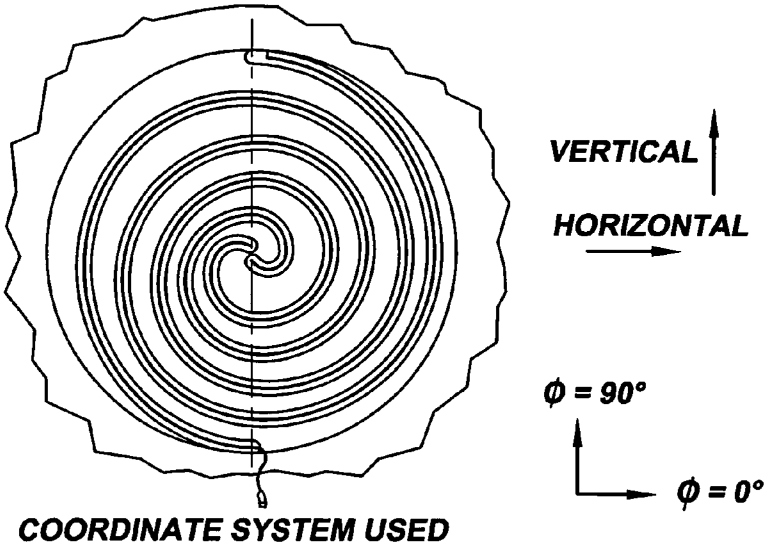

A measure of the dominance of one polarization over another is known as an axial ratio. Referring to FIG. 3C, a legend is shown corresponding to this measurement. One measure of the signal is its gain in decibels (dB). The axial ratio can be defined as the difference in gain between vertical and horizontal polarization at a particular frequency (GAIN (V)–GAIN(H)). An antenna with circular polarization has an axial ration near 0 dB.

Figure 4:
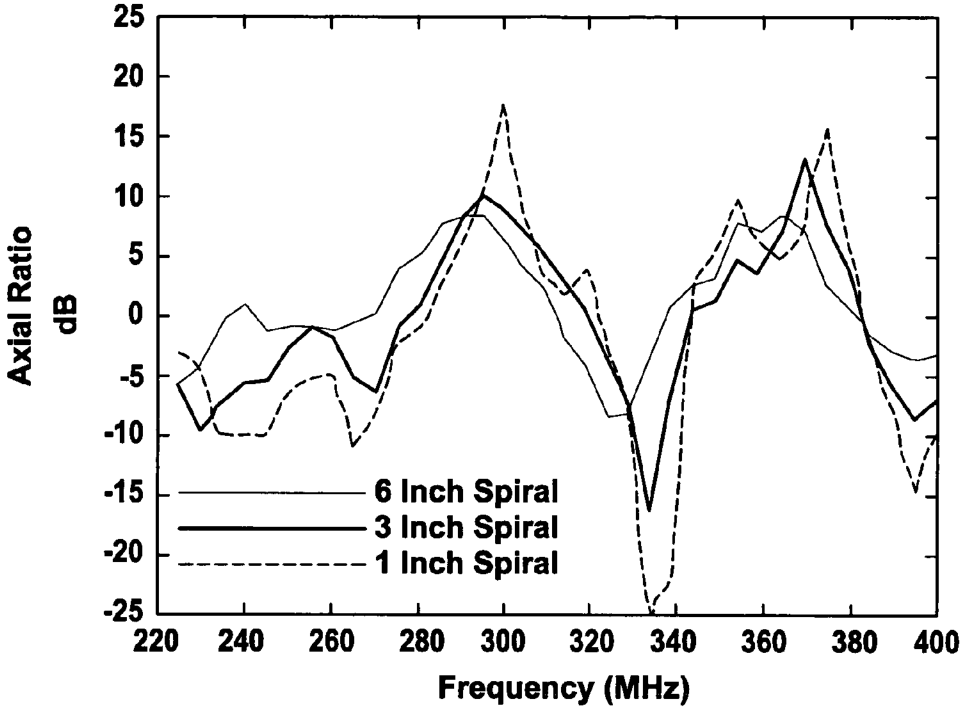
FIG. 4 presents data on the axial ratio collected on three-turn conductor-backed spiral antennas as a function of frequency between 225 MHZ and 400 MHZ for spiral antennas having 6 inch, 3 inch and 1 inch thick dielectric spacing.

FIG. 4 presents data on the axial ratio for a three-turn, 1, 3 and 6-inch thick dielectric spiral as a function of frequency between 225 and 400 MHZ and illustrates the linear polarization characteristic of the conductor-backed spiral antenna. This data was obtained at 5 MHZ frequency intervals at the Space and Naval Warfare Systems Center antenna range located in San Diego, Calif. Each three-turn spiral antenna had a frequency difference between successive maximums between 70 and 75 MHZ.

The 6-inch thick spiral had a difference between maximum and minimum for an axial ratio of 17.15 dB. The 3-inch thick spiral had a corresponding difference of 30.45 dB. The difference for the 1-inch thick spiral was 42.59 dB. This data of course indicates that the thinner dielectric substrate provides the most profound change in gain between polarizations, suggesting that minimizing the substrate thickness will accentuate a change in polarization as frequency increases.

Figure 5:
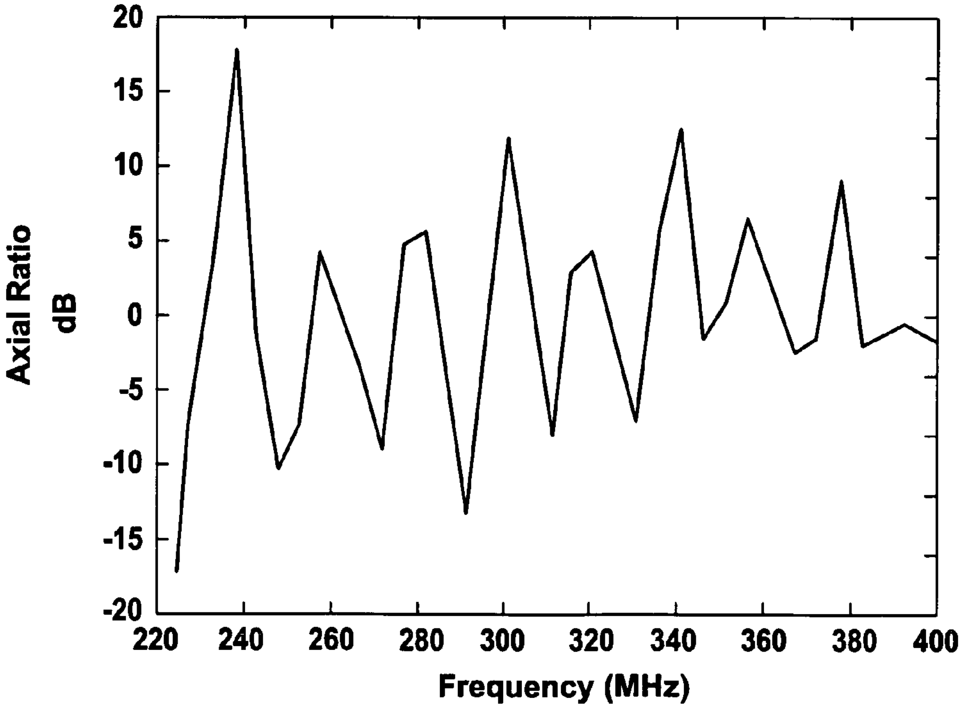
FIG. 5 presents data for the axial ratio collected on a ten-turn conductor-backed spiral antenna as a function of frequency between 225 MHZ and 400 MHZ in which the spiral antenna has a 1 inch thick dielectric spacing.

FIG. 5 presents data for the axial ratio of a ten-turn, 1-inch thick spiral. The additional turns can be applied and connected as with the three turn embodiment of the invention. The data shows a rapid variation in polarization change as a function of frequency. The difference between maximum and minimum was found to be 36.47 dB.

Figure 6:
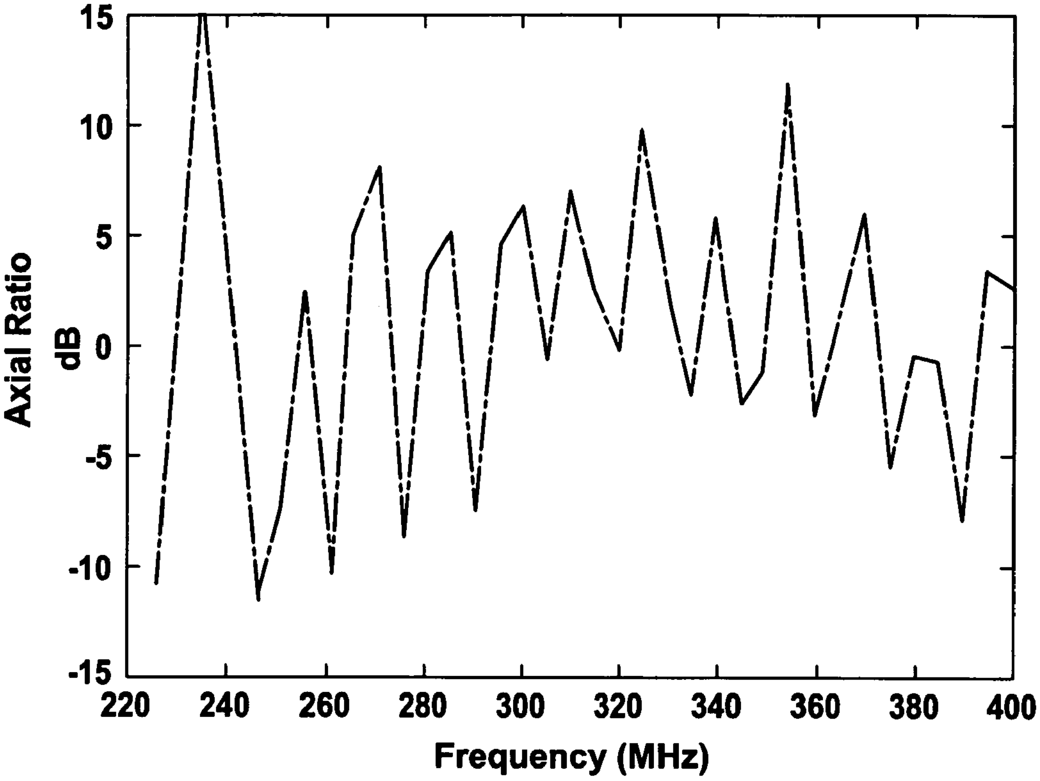
FIG. 6 presents data for the axial ratio collected on a twelve-turn conductor-backed spiral antenna as a function of frequency between 225 MHZ and 400 MHZ in which the antenna has a 3 inch thick dielectric spacing.

FIG. 6 presents the axial ratio for a twelve-turn, 3-inch thick dielectric spiral antenna. As with the other embodiments of the invention, the additional turns can be similarly applied and connected. Measurements were obtained at frequency intervals of 1 MHz. The frequency difference between successive maximums was 18 MHZ, a factor of 4 smaller than the three-turn spiral. The difference between maximum and minimum was 32.4 dB.

A factor that limits the number of signals that can be transmitted simultaneously is the frequency spectrum allotted to the application. Typically, providers pay huge sums of money to purchase the rights to use portions of the frequency spectrum. A broad band device that can double the number of users within a frequency band would be very advantageous.

The invention is a method and a device that uses the frequency spectrum more efficiently. The device described will at least double the number of users that can send signals within a particular frequency band. The invention includes a compact antenna with linear polarization and a broad frequency spectrum over which it can radiate efficiently. The conductor-backed spiral antenna described also has a 6 dB advantage in gain on transmit and receive over cavity-backed spiral antenna designs. These designs absorb half the power used via a lossy material in the cavity behind the spiral.

One feature of the conductor-backed spirals described is that if the thickness of the dielectric layer that separates the spiral antenna elements from the conductor is small compared to the utilized wavelength, the polarization of the antenna will be dependent on the frequency. The variation of the polarization depends upon both the thickness and the number of antenna element turns. This variation of the polarization with frequency presents the further advantage that two signals in the same antenna with slightly different frequencies will be somewhat isolated from each other. A given frequency band can thus be further divided into sub-bands using these antennas.

Obviously, many modifications and variations of the invention are possible in light of the above teachings. It is therefore to be understood that within the scope of the appended claims the invention may be practiced otherwise than as has been described.

What is claimed is:

1. An antenna apparatus comprising:

first and second linearly-polarized conductor-backed spiral antennas wherein said antennas both simultaneously transmit or both simultaneously receive on substantially the same frequencies, wherein said antennas are spaced from each other and further wherein each of said antennas comprises:

a substrate having first and second flat, opposite, sides;

a pair of spiral antenna elements disposed on said first side of said substrate in which each of said elements has a corresponding feed point; and a conducting ground plane disposed on said second side of said substrate, wherein said first antenna and said second antenna are oriented so that an imaginary line drawn through said feed points corresponding to said first antenna is orthogonal to an imaginary line drawn through said feed points corresponding to said second antenna.

2. The apparatus of claim 1 wherein said antennas are spaced vertically to radiate substantially parallel.

3. The apparatus of claim 1 in which said spiral elements take the form of an Archimedean spiral.

4. The apparatus of claim 1 wherein said spiral elements comprise a metal foil.

5. The apparatus of claim 1 wherein said antenna elements of said first and second antennas are mounted in a common plane.

6. The apparatus of claim 1 wherein said substrate has a dielectric constant of approximately 1.

7. The apparatus of claim 6 wherein said substrate comprises a dielectric of DIVINYCELL (trademark).

8. The apparatus of claim 1 wherein said first and second antennas share a common conducting ground plane.

9. An antenna apparatus comprising:

first and second linearly-polarized conductor-backed spiral antennas wherein said antennas both simultaneously transmit or both simultaneously receive on substantially the same frequencies, wherein said antennas are spaced from each other and further wherein each of said antennas comprises:

a substrate having first and second flat, opposite, sides;

a pair of spiral antenna elements disposed on said first side of said substrate in which each of said elements has a corresponding feed point; and a conducting ground plane disposed on said second side of said substrate, wherein said first antenna and said second antenna are oriented so that an imaginary line drawn through said feed points corresponding to said first antenna does not coincide with an imaginary line drawn through said feed points corresponding to said second antenna and wherein the performance of each of said antennas can be described by an axial ratio defined as the difference between vertical gain and horizontal gain at a particular frequency and wherein said axial ratio varies by no less than plus or minus 5 dB.

10. The apparatus of claim 9 wherein said spiral antenna elements makes at least three 360 degree turns.

11. The apparatus of claim 10 wherein said substrate separates said spiral antenna elements from said conducting ground plane by a distance that is no greater than 6 inches.

12. The apparatus of claim 11 wherein said imaginary line drawn through said feed points corresponding to said first antenna is orthogonal to said imaginary line drawn through said feed points corresponding to said second antenna.

13. The apparatus according to claim 11 wherein said antennas operate between 225 megaHertz and 400 megaHertz.

14. The apparatus of claim 10 wherein said substrate separates said spiral antenna elements and said conducting ground plane by a distance that is no greater than 3 inches.

15. The apparatus of claim 14 wherein said imaginary line drawn through said feed points corresponding to said first antenna is orthogonal to said imaginary line drawn through said feed points corresponding to said second antenna.

16. The apparatus of claim 14 wherein said antennas operate between 225 megaHertz and 400 megaHertz.

17. The apparatus of claim 10 wherein said substrate separates said spiral antenna elements and said conducting ground plane by a distance that is no greater than 1 inch.

18. The apparatus of claim 17 wherein said imaginary line drawn through said feed points corresponding to said first antenna is orthogonal to said imaginary line drawn through said feed points corresponding to said second antenna.

19. The apparatus of claim 17 wherein said antennas operate between 225 megaHertz and 400 megaHertz.

20. An antenna apparatus comprising:

first and second linearly-polarized conductor-backed spiral antennas wherein said antennas both simultaneously transmit or both simultaneously receive on substantially the same frequencies, wherein said antennas are spaced from each other and further wherein each of said antennas comprises:

a substrate having first and second flat, opposite, sides;

a pair of spiral antenna elements disposed on said first side of said substrate in which each of said elements has a corresponding feed point, said spiral antenna elements making at least three 360 degree turns; and a conducting ground plane disposed on said second side of said substrate, wherein said substrate separates said spiral antenna elements from said conducting ground plane by a distance that is no greater than 6 inches, wherein said first antenna and said second antenna are oriented so that an imaginary line drawn through said feed points corresponding to said first antenna is orthogonal to an imaginary line drawn through said feed points corresponding to said second antenna.

21. The apparatus of claim 20 wherein said antennas are spaced vertically.

22. The apparatus of claim 20 in which said spiral takes the form of an Archimedean spiral.

23. The apparatus of claim 20 wherein said spiral elements comprise a metal foil.

24. The apparatus of claim 20 wherein said antenna elements of said first and second antennas are mounted in a common plane.

25. The apparatus of claim 20 wherein said substrate has a dielectric constant of approximately 1.

26. The apparatus of claim 25 herein said substrate comprises a dielectric of DIVINYCELL (trademark).

27. The apparatus of claim 20 wherein said first and second antennas share a common conducting ground plane.

28. The apparatus according to claim 20 wherein said antennas operate between 225 megaHertz and 400 megaHertz.

29. The apparatus of claim 20 wherein said substrate separates said spiral antenna elements and said conducting ground plane by a distance that is no greater than 3 inches.

30. The apparatus of claim 29 wherein said antennas operate between 225 megaHertz and 400 megaHertz.

31. The apparatus of claim 20 wherein said substrate separates said spiral antenna elements and said conducting ground plane by a distance that is no greater than 1 inch.

32. The apparatus of claim 31 wherein said antennas operate between 225 megaHertz and 400 megaHertz.

33. A communications method comprising:

using first and second linearly polarized, conductor-backed spiral antennas to both simultaneously transmit or both simultaneously receive on substantially the same frequencies, wherein said antennas are spaced from each other and further wherein each of said antennas comprises:

a substrate with first and second flat, opposite, sides;

a pair of spiral antenna elements disposed on said first side of said substrate in which each of said elements has a corresponding feed point, said spiral antenna elements making at least three 360 degree turns; and a conducting ground plane disposed on said second side of said substrate, wherein said substrate separates said spiral antenna elements from said conducting ground plane by a distance that is no greater than 6 inches, wherein said first antenna and said second antenna are oriented so that an imaginary line drawn through said feed points corresponding to said first antenna does not coincide with an imaginary line drawn through said feed points corresponding to said second antenna.

34. The method of claim 33 wherein said antennas are oriented so that said imaginary line drawn through said feed points corresponding to said first antenna is orthogonal to said imaginary line drawn through said feed points corresponding to said second antenna.

35. The method of claim 34 wherein said antennas are spaced vertically.

36. The method of claim 33 wherein said antenna elements of said first and second antennas are mounted in a common plane.

37. The method of claim 33 wherein said first and second antennas are included in a first antenna array and further wherein duplicates of said first and second antennas are included in a second antenna array.

38. The method according to claim 37 wherein said first and second antenna arrays are used for transmitting and receiving communication on substantially the same frequencies wherein one of said arrays is used for transmitting and the other of said arrays is used for receiving.

39. The method of claim 34 wherein said first and second antennas are included in a first antenna array and further wherein duplicates of said first and second antennas are included in a second antenna array.

40. The method according to claim 38 wherein said first and second antenna arrays are used for transmitting and receiving communication on substantially the same frequencies wherein one of said arrays is used for transmitting and the other of said arrays is used for receiving.

41. The method according to claim 33 wherein said antennas are operated between 225 megaHertz and 400 megaHertz.

42. The method of claim 33 wherein said substrate separates said spiral antenna elements and said conducting ground plane by a distance that is no greater than 3 inches.

43. The method of claim 42 wherein said antennas operate between 225 megaHertz and 400 megaHertz.

44. The method of claim 33 wherein said substrate separates said spiral antenna elements and said conducting ground plane by a distance that is no greater than 1 inch.

45. The method of claim 44 wherein said antennas operate between 225 megaHertz and 400 megaHertz.

* * * * *